United States Patent
Yamagata et al.

(10) Patent No.: US 8,423,829 B2
(45) Date of Patent: Apr. 16, 2013

(54) FAILURE ANALYSIS APPARATUS, METHOD

(75) Inventors: Shunsuke Yamagata, Kawasaki (JP); Hiroyuki Suzuki, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 561 days.

(21) Appl. No.: 12/695,897

(22) Filed: Jan. 28, 2010

(65) Prior Publication Data

US 2010/0191941 A1 Jul. 29, 2010

(30) Foreign Application Priority Data

Jan. 29, 2009 (JP) ................................ 2009-018374

(51) Int. Cl.
*G06F 11/00* (2006.01)
(52) U.S. Cl.
USPC .......................................................... 714/33
(58) Field of Classification Search ................... 714/33; 712/227
See application file for complete search history.

(56) References Cited

U.S. PATENT DOCUMENTS

| | | | | |
|---|---|---|---|---|
| 6,055,661 A * | 4/2000 | Luk | ................. | 714/736 |
| 6,247,144 B1 * | 6/2001 | Macias-Garza et al. | ......... | 714/25 |
| 6,463,551 B1 * | 10/2002 | Kanzaki et al. | ................. | 714/30 |
| 6,922,821 B1 * | 7/2005 | Nemecek | ....................... | 716/136 |
| 7,080,283 B1 * | 7/2006 | Songer et al. | ................... | 714/30 |
| 7,185,235 B2 * | 2/2007 | Radestock | ................... | 714/47.1 |
| 7,475,387 B2 * | 1/2009 | Chandane | ..................... | 717/128 |
| 2007/0174037 A1 * | 7/2007 | Ling | ............................ | 703/28 |
| 2008/0250397 A1 * | 10/2008 | Dahms et al. | ................. | 717/129 |

FOREIGN PATENT DOCUMENTS

| | | |
|---|---|---|
| JP | 05-073347 A | 3/1993 |
| JP | 05-119116 A | 5/1993 |

* cited by examiner

*Primary Examiner* — Scott Baderman
*Assistant Examiner* — Yair Leibovich
(74) *Attorney, Agent, or Firm* — Sughrue Mion, PLLC

(57) ABSTRACT

A debugger is operated in a host PC, and in response to operation of the debugger, first and second microprocessors execute an identical debug operation in parallel via first and second debug I/F devices. The host PC obtains internal information (dump results) from the first and second microprocessors via the first and second debug I/F devices and compares internal information (dump results) from the first and second microprocessors to perform failure analysis.

6 Claims, 10 Drawing Sheets

BASIC CONFIGURATION BLOCK DIAGRAM OF EXEMPLARY EMBODIMENT OF PRESENT INVENTION

FAILURE ANALYSIS APPARATUS, METHOD

TECHNICAL FIELD

Reference to Related Application

This application is based upon and claims the benefit of the priority of Japanese patent application No. JP2009-018374, filed on Jan. 29, 2009, the disclosure of which is incorporated herein in its entirety by reference thereto.

The present invention relates to technology for device evaluation analysis, and in particular to an apparatus, method, and program suited for failure analysis of a microprocessor.

BACKGROUND

With regard to testing an LSI circuit (Large Scale Integrated circuits), a configuration is disclosed in Patent Document 1, for example, as shown in FIG. 9, where a non-defective LSI circuit 11 that has been confirmed in advance to be non-defective, and an LSI circuit 12 under measurement are synchronized and operated under identical test input conditions, and a determination is made as to whether or not the LSI circuit 12 under measurement performs an operation that is functionally identical to the non-defective LSI circuit 11.

Furthermore, with regard to an emulation device for performing emulation of a processor under test, as an in-circuit emulator (ICE) that performs emulation in realtime, a configuration is disclosed in Patent Document 2, for example, as shown in FIG. 10, which is provided with a storage means (trace memory unit) 5 that stores in advance reference data corresponding to an expected instruction execution result for a processor (MPU) 3 under test and that sequentially outputs reference data based on an external clock signal synchronous with an instruction execution cycle of the processor (MPU) 3 under test; a comparison means (comparator unit) 7 that compares the execution result of the processor (MPU) 3 under test and the output reference data; and a control means (controller) 4 that performs interruption and continuation of emulation based on a comparison result signal.
[Patent Document 1]
JP Patent Kokai Publication No. JP-A-5-119116
[Patent Document 2]
JP Patent Kokai Publication No. JP-A-5-73347

SUMMARY

The entire disclosures of Patent Documents 1 and 2 are incorporated herein by reference thereto. The following analysis is given according to the present invention.

With regard to performing analysis (failure analysis) of a defective microprocessor, even when a defect phenomenon in a microprocessor can be reproduced by an LSI tester, with regard to defect information (fail log data) obtained from the LSI tester, only a portion of results output from an external terminal of the defective microprocessor is obtained, and an internal state in an operation process of the defective microprocessor cannot be ascertained.

Furthermore, even if an abnormal operation occurs in the microprocessor, a result of the abnormal operation may not be promptly output to an output port of the microprocessor. In such a case, it is difficult to judge at what point in time a defective operation has occurred, and it is difficult to identify a true cause of failure.

Moreover, according to simulation environment, a detailed investigation of a defect is burdensome, and can be said to be unsuitable in cases requiring urgent analysis.

The configuration of Patent Document 1 shown in FIG. 9 is dedicated to defect detection. In case results of an identical operation in two microprocessors are compared and are found not to match, it is not possible to identify which instruction at which address in a program executed has caused the mismatch, nor to ascertain the value of a memory or register in the microprocessor. This is because of the lack of a way of investigating detailed information inside the microprocessor.

With the configuration of Patent Document 2 shown in FIG. 10, it is not possible to perform a failure analysis when a defect occurs with an instruction that is not expected in advance. This is because in the configuration of Patent Document 2, it is necessary to have an instruction with which a defect is expected to occur, and to prepare a huge amount of expected value data for execution results thereof.

The present invention has been invented to solve at least one of the abovementioned problems.

According to the present invention there is provided a failure analysis apparatus that includes: a host machine; first and second microprocessors of an identical configuration, wherein the first microprocessor is a known good device, while the second microprocessor is a target for failure analysis; and first and second debug interface devices connecting the host machine to the first and second microprocessors, respectively. The host machine comprises a means that causes the first and second microprocessors to execute identical debug operations in parallel, via the first and second debug interface devices, obtains internal information of the first and second microprocessors via the first and second debug interface devices, and compares the internal information of the first and second microprocessors to perform failure analysis of the second microprocessor.

According to the present invention there is provided a failure analysis method in which a debugger of a microprocessor operates in a host machine. The host machine causes via the first and the second debug interface devices the first and the second microprocessors, wherein the first microprocessor is a known good device, while the second microprocessor is a target for failure analysis, having an identical configuration to executes identical debug operations in parallel, and the host machine compares internal information obtained from the first and the second microprocessors to performs failure analysis of the second microprocessor.

According to the present invention there is provided a computer readable recording medium storing a program that causes a host machine connected to first and second microprocessors of an identical configuration, wherein the first microprocessor is a known good device, while the second microprocessor is a target for failure analysis, via first and second debug interface devices respectively to execute processes comprising:

a process that causes the first and the second microprocessors to execute identical debug operations in parallel, via the first and the second debug interface devices, and a process that obtains internal information of the first and the second microprocessors via the first and the second debug interface devices and compares the internal information of the first and the second microprocessors to perform failure analysis of the second microprocessor.

According to the present invention it is possible to easily detect and perform phenomenon confirmation for a defect in a microprocessor without having a simulation environment.

BRIEF DESCRIPTIONS OF THE DRAWINGS

PREFERRED MODES

Figure 1:
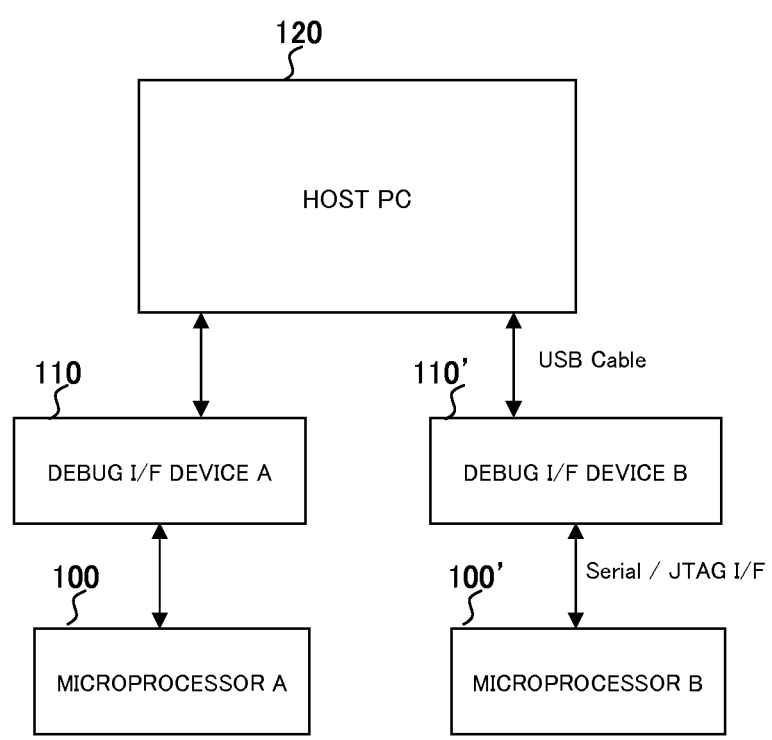
FIG. 1 is a diagram showing a configuration of one exemplary embodiment of the present invention.

According to the present invention, there are provided: a host machine (host PC 120 in FIG. 1) in which a microprocessor debugger operates, first and second microprocessors (100 and 100' in FIG. 1) of an identical configuration, and first and second debug I/F (interface) devices (110 and 110' in FIG. 1) respectively connected to the first and second microprocessors and the host machine. The host machine (120) executes identical debug operations in parallel with respect to the first and the second microprocessors (100 and 100') via the first and second debug I/F devices (110 and 110'), obtains and compares internal information (dump results) of the first and the second microprocessors (100 and 100'), and performs failure analysis. In the present invention, one of the microprocessors (the first microprocessor) is non-defective, and the other microprocessor (the second microprocessor) is a microprocessor subjected to failure analysis.

In the present invention, the host machine (120) sets a plurality of break points in a program of the first and the second microprocessors (100 and 100'), and in case internal information obtained from the first and the second microprocessors (100 and 100') at a first break point matches, and internal information obtained from the first and the second microprocessors (100 and 100') at a second break point executed after the first break point does not match, as a subsequent operation, a debug command is changed so that instructions between the first break point and the second break point are executed one step at a time and the changed command is given to the first and the second microprocessors.

Or, in the present invention, the host machine (120) may set break points in a binary search manner to respect to the first and the second microprocessors (100 and 100') and failure analysis may be performed. In the present invention, with regard to first and second break points which are a start and an end of a search range determined by performing a prescribed number of binary search of break points, the host machine (120) may execute a program in the first and the second microprocessors (100 and 100') from the start thereof to the first break point, and thereafter may perform step execution to the second break point.

In the present invention, in case the internal information obtained from the first and the second microprocessors (100 and 100') does not match at one break point, the host machine (120) may perform control so as to set at least a portion of the internal information of the first microprocessor (100) as internal information of the second microprocessor (100') and then to re-execute the step execution.

In the present invention, in the re-execution, in case the internal information obtained from the first and the second microprocessors (100 and 100') at one break point does not match, the host machine (120) stores mismatching information in a storage unit. At the end of re-execution, in case there are plural locations of mismatching information stored in the storage unit, a common point of at least two items of mismatching information from among the information of plural mismatching locations is extracted. That is, as a result of a comparison of internal information (dump results) of the first and the second microprocessors (100 and 100'), in a case of not-matching, the mismatching information (internal information) may be stored, and after writing the internal information of a non-defective microprocessor to the defective microprocessor, step execution or break point setting or the like may be performed. In case two or more mismatching locations (execution halt locations in the program) have been found, respective mismatching information items that are stored subsequently may be compared, and information (common points) related to matching items may be stored.

In this way, in the present invention, two debug I/F (interface) devices and microprocessors may be connected to one host machine (120), and internal information (dump results) that is an operation result of two microprocessors: non-defective and failure analysis target, at a break point, are compared by the host machine. As a result of the comparison, when mismatching is detected, information on the defective microprocessor RAM, register, execution instruction address and the like are stored in memory. In addition, according to a comparison result of the internal information (dump result) of the two microprocessors, control to change emulation interruption, continuation, and other debug operations to efficient operations thereof is preferably realized by software. According to the present invention, it is possible to operate and compare a plurality of defective products at the same time. In case no mismatching has been detected as a result of program execution and comparison with regard to two microprocessors: non-defective and failure analysis target, switching to a subsequent program and loading of the program may be performed automatically. Or, break points may be automatically re-set, and the program re-executed. A description is given below according to exemplary embodiments.

First Exemplary Embodiment

FIG. 1 is a diagram showing a configuration of a failure analysis apparatus of a first exemplary embodiment of the present invention. Referring to FIG. 1, the failure analysis apparatus of the exemplary embodiment of the present invention includes microprocessors A and B (100 and 100') each of which has an on-chip debug function, debug interface (I/F) devices A and B (110 and 110') that are connected respectively to the microprocessors A and B (100 and 100') and that support the debug function, and a host PC (HOST PC, also referred to simply as "host") 120 that is connected to each of the microprocessors A and B (100 and 100') via the debug I/F devices (110 and 110') and that performs debugging. The microprocessors A and B (100 and 100') each have a CPU (Central Processing Unit) that executes instructions, and an on-chip debug circuit that performs breaks, memory dumps, and so forth, as on-chip debug functions (or has a means that can execute equivalent functions). The on-chip debug circuit mounted on a chip (microprocessor) includes a part of a debug circuit provided in an in-circuit emulator (ICE) and realizes an emulation function using an actual device (microprocessor) at evaluation time.

The microprocessor A (100) is a microprocessor (KGD: Known Good Device) that has been confirmed in advance as being non-defective and the microprocessor B (100) is a target microprocessor of failure analysis. The microprocessors A (100) and B (100') have an identical configuration. The debug I/F devices A and B (110 and 110') have an identical configuration (identical specification).

The host PC 120 and the debug I/F devices A and B (110 and 110') are connected by, for example, a USB (Universal Serial Bus) interface.

The debug I/F devices A and B (110 and 110') receive commands from a debugger operating in a CPU 121 of the host PC 120, via a communication unit such as a USB interface, and send debug results (dump information, trace information and so forth) obtained from the respective microprocessors A and B (100 and 100') to the host PC 120.

The debug I/F devices A and B (110 and 110') and the microprocessors A and B (100 and 100') are connected respectively by, for example, a JTAG (Joint Tag Action Group) interface or the like.

Figure 2A:
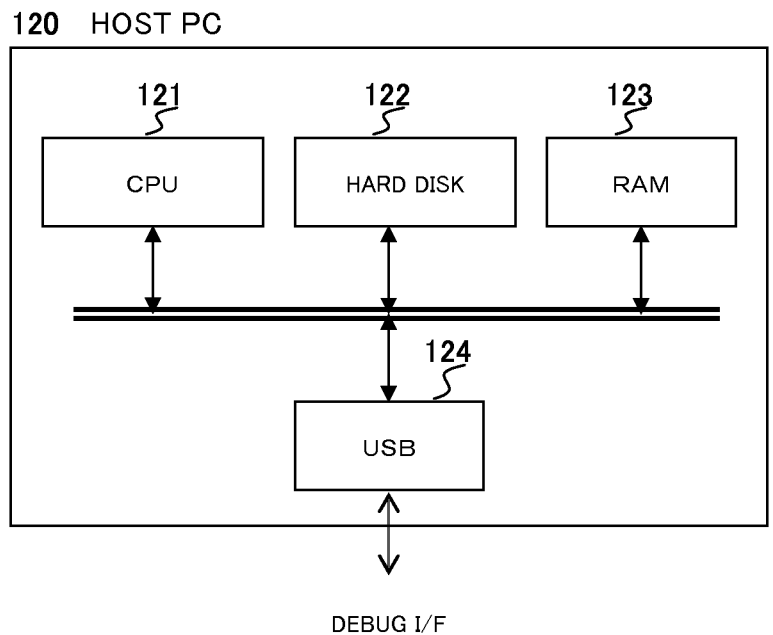
FIGS. 2A and 2B are diagrams showing a host PC and a microprocessor of the exemplary embodiment of the present invention.

FIG. 2A is a diagram showing one example of a configuration of the host PC 120. Referring to FIG. 2A, the host PC 120 includes a CPU 121 that is necessary for starting and executing a debugger tool, a main memory device (RAM: random access memory) 123, an auxiliary storage device (hard disk) 122, and two or more communication units 124 such as a USB for connecting with the debug I/F devices A and B (110 and 110').

In the CPU 121 of the host PC 120, when debugging is carried out, debugging software (also referred to as "emulation software") is invoked, and according to an operation of the debugger the two microprocessors A and B (100 and 100') perform an identical debug operation via the debug I/F devices A and B (110 and 110') and obtain internal information of devices such as an internal register, RAM, or the like, of each of the two microprocessors A and B (100 and 100'). Here, a debugging operation refers to execution of a user program, break control that puts a break at a prescribed location, execution of a step performing program execution and halting for each instruction, reading/writing of memory/register contents during a break, and the like.

The internal information obtained from the microprocessors A and B (100 and 100'), after being sent to the host PC 120 and stored once in a storage device (buffer or the like) in the host PC 120, undergoes a comparison, and by storing a state (internal information) when mismatching has been detected in the storage device and confirming the state, detection (confirmation) of an abnormal state, failure analysis and the like is performed.

Figure 2B:
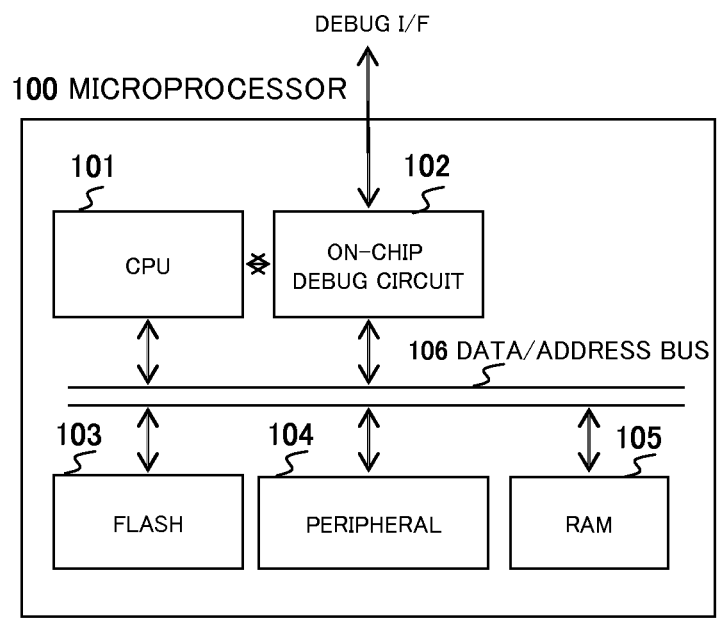

FIG. 2B is a diagram showing one example of a configuration of the microprocessors A and B (100 and 100') of FIG. 1. The microprocessors A and B (100 and 100') have an identical configuration. Referring to FIG. 2B, the microprocessors A and B (100 and 100') each include a CPU 101, an on-chip debug circuit 102, a nonvolatile flash memory (FLASH) 103 that is connected to the CPU 101 via a bus (data/address bus) 106 and that is electrically programmable, a peripheral circuit (PERIPHERAL) 104, and RAM (random access memory) 105. A control signal, a clock (CLK), and the like (not shown) are transferred on the bus 106. FIG. 2B schematically shows one example of the microprocessors A and B (100 and 100') to which the present invention can be applied. In the present invention, the microprocessors A and B are not limited to only the configuration of FIG. 2B.

The on-chip debug circuit 102 of the microprocessors A and B (100 and 100') communicates with the debug I/F devices A and B (110 and 110') via a JTAG interface (serial; UART (Universal Asynchronous Receiver and Transmitter) and the like are also possible).

The on-chip debug circuit 102 of the microprocessors A and B (100 and 100') receives a debug command from the host PC 120 via the JTAG interface of the debug I/F devices A and B (110 and 110'), performs a debug operation of the CPU 101, and sends register and memory dump information at a break point to the debug I/F devices A and B (110 and 110') via the JTAG interface.

In the present exemplary embodiment, the debug I/F devices A and B (110 and 110') operates as a conversion device for converting a debug command from the host PC 120 to a command which the microprocessors A and B (100 and 100') can receive and decode.

In the present exemplary embodiment, two debug I/F devices A and B (110 and 110') are connected to one host PC 120, an identical debug operation is executed in parallel with respect to the two microprocessors A and B (100 and 100'), and by comparing debug results by the host PC 120, fault detection and failure analysis is executed. That is, in the host PC 120, the debugger software for executing on-chip debugging operates, and in response to an operation by a user or according to autonomous control by the debugger software, identical debugging operations are executed in parallel in the two microprocessors A and B (100 and 100'). In addition to this, in the host PC 120 a failure analysis program, not shown in FIG. 1 operates in the CPU 121. The failure analysis program may be embedded in a part of the debugger software functions.

The failure analysis program that operates in the CPU 121 of the host PC 120 stores register and memory values of each of the two microprocessors A and B (100 and 100') obtained by the debugger software, makes a comparison, and in case mismatching is detected, stores information of the memory value, program counter value, and the like, and according to the situation, performs control of the debugger software as to which type of procedure is to be performed next, in accordance with control flow programmed in beforehand.

Figure 3:
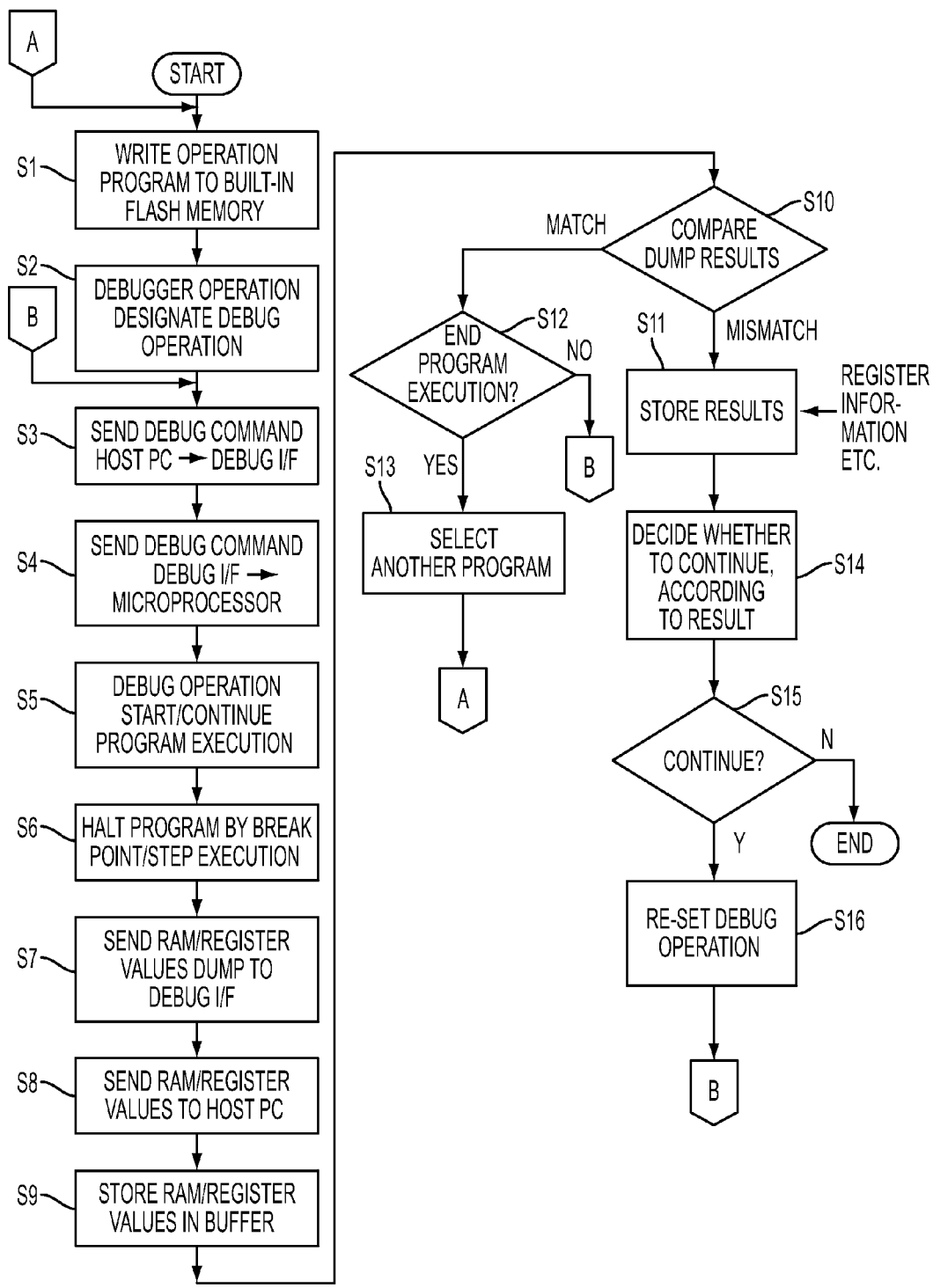
FIG. 3 is a flow diagram describing operations of the exemplary embodiment of the present invention.

FIG. 3 is a flow diagram for describing operation of the exemplary embodiment of the present invention. Operation of the present exemplary embodiment will now be described with reference to FIG. 1, FIG. 2, and FIG. 3.

A user program (operation program) to be executed is written in advance using a flash writer or the like, to electrically erasable and programmable non-volatile memory (for example, FLASH memory) (103 in FIG. 2B) mounted in the microprocessors A and B (100 and 100') (step S1). In case a flash writer function is installed in the debug I/F devices A and B (110 and 110'), the user program (operation program) may be written to the FLASH memory (103 in FIG. 2B) of the microprocessors A and B (100 and 100'), using this function of the debug I/F devices A and B (110 and 110').

The user operates the debugger on the host PC 120, and specifies a debug operation (step S2). In the present exemplary embodiment, the debug operation in the debugger in step S2 is not only specified by a user operation, and may be automatically (autonomously) specified by debugger software (or a failure analysis program) that operates in the host PC 120.

The debug direction (debug command (directive)) from the debugger software operating in the host PC 120 is transmitted to each of the debug I/F devices A and B (110 and 110') (step S3). For example, a break point, program execution start address, end address, type of register to be obtained, and address of RAM are specified.

The debug I/F devices A and B (110 and 110') each carry out communication with the microprocessors A and B (100 and 100') respectively connected thereto, and direct a debug command received from the debugger software operating in the host PC 120 commonly to on-chip debug circuits 102 of the microprocessors A and B (100 and 100') (step S4).

The on-chip debug circuits 102 of the microprocessors A and B (100 and 100') receive debug commands from the debug I/F devices A and B (110 and 110') respectively, and cause CPUs 101 of the microprocessors A and B (100 and 100') (step S5) to start program execution. At this time, operations executed by the two microprocessors A and B (100 and 100') are identical.

In the first and the second microprocessors A and B (100 and 100'), after the program is executed as far as a break point that has been set, the program execution is interrupted (halted) by a break point function of the on-chip debug circuits 102 in the microprocessors A and B (100 and 100') (step S6).

At this time, values (dump information) of the RAMs 105, registers, and so forth in the first and the second microprocessors A and B (100 and 100') are sent to the debug I/F devices A and B (110 and 110') by a debug monitoring function provided in the on-chip debug circuits 102 of the microprocessors A and B (100 and 100'), according to a command received from the debugger software of the host PC 120, (step S7).

The debug I/F devices A and B (110 and 110') receive values of the RAMs 105 and register of the microprocessors A and B (100 and 100'), respectively from the microprocessors A and B (100 and 100') and send the received values to the host PC 120 (step S8).

The host PC 120 stores the information of RAMs 105, registers and the like, of each of the microprocessors A and B (100 and 100') sent by the debug I/F devices A and B (110 and 110'), in a storage device (buffer memory in the RAM 123 or the like) (step S9).

The host PC 120 compares corresponding items of information (dump results) of the RAMs 105, registers, and the like, of the microprocessors A and B (100 and 100') stored in the storage device (step S10). A comparison operation of the dump results is executed by the failure analysis program operating in the CPU 121 of the host PC 120.

In case comparison results of step S10 match, the host PC 120 releases a break condition so that program execution after the break point can continue. A command for restarting the program is transferred to the microprocessors A and B (100 and 100') via the debug I/F devices A and B (110 and 110') from the host PC 120 (steps S12 and S13).

In case the comparison results of step S10 do not match ("mismatch" branch of step S10), the host PC 120 stores the RAM and register information, and information of execution instruction, program counter and the like at that time in a hard disk 122, for example, in the host PC 120 (step S11).

In the host PC 120, a decision as to whether or not to continue debugging is made (step S14). A decision to continue debugging in step S14 may be made by a user operation on the host PC 120, or may be made automatically by control of software (failure analysis program or the like) operating in the host PC 120. If the debugging ("Y" branch in step S15) is continued, the debug operation may be changed by setting the debug operation to be executed next in accordance with the state of occurrence of the comparison result mismatch (step S16). This is controlled by setting in advance a condition as to what type of operation is desired, and by an operation of the software (failure analysis program and the like) in the host PC 120. In case a decision is made to end the debugging, in the host PC 120 ("N" branch in step S15) debugging is ended.

Figure 4:
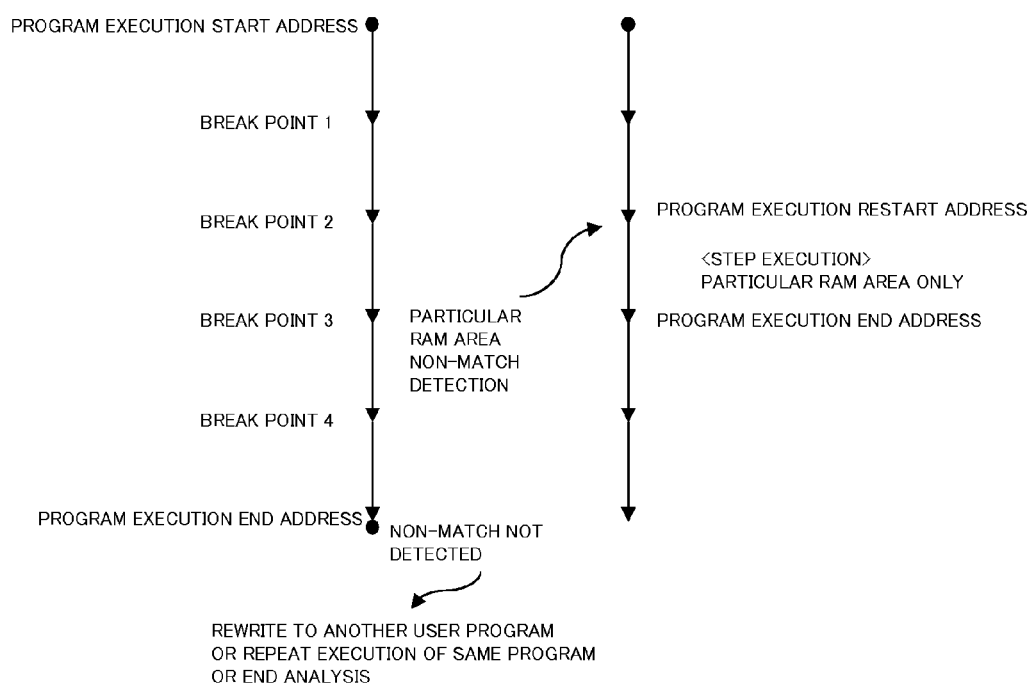
FIG. 4 is a diagram describing operations of the exemplary embodiment of the present invention.

FIG. 4 is a diagram describing an example of a debug procedure of a microprocessor in the present exemplary embodiment. For example, several break points (BREAK POINTs 1 to 4 in FIG. 4) are set in advance in a program by an on-chip debug circuit 102 of the microprocessors A and B (100 and 100'), and the program is executed from a program execution start address in each CPU 101 of the microprocessors A and B (100 and 100'). When a program counter (not shown in the drawings) in the CPUs 101 of the microprocessors A and B (100 and 100') matches with an address at which a break point has been set, execution of the program is halted at the address of the break point, and at that point in time, dump result information of the values of the RAMs 105, registers, and so forth of the microprocessors A and B (100 and 100') is sent to the host PC 120 via the debug I/F devices A and B (110 and 110').

In case the host PC 120 detects a mismatch in internal information (dump results) of the microprocessors A and B (100 and 100') at break point 3, as a subsequent operation a debug command is changed so as to perform step execution (execution of one instruction at a time within the program) between break point 2 and break point 3, for example, and a setting is made in the on-chip debug circuits 102 of the microprocessors A and B (100 and 100').

When the mismatching data (dump results) at this time is a specific address of the RAMs 105 of the microprocessors A and B (100 and 100'), for example, in order to effectively identify a fault location, data (to be compared) that are read thereafter may be limited to only the specific address of the RAMs 105.

When the comparison result of internal information of the microprocessors A and B (100 and 100') at each halt point match in the step execution from break point 2, the program execution is restarted in a similar way, and repetition is performed as: halt after next instruction execution→read data of RAMs 105→compare.

When the comparison result of internal information of the microprocessors A and B (100 and 100') at a halt point do not match in the step execution from break point 2, storing of register values is executed in step S11 of FIG. 3, and the debug operation is completed. However, another operation can be performed according to setting.

When the program is executed to the end without detecting a mismatch in the debug operation of the microprocessors A and B (100 and 100'), control returns to step S1 and another program is loaded. This operation is also controlled automatically by embedding the operation in the debug program in advance.

As described above, according to the present exemplary embodiment, by using a debug function, an identical debug operation is performed in the microprocessor A (100) which has been confirmed to be non-defective, and the microprocessor B (100'), which is a target of failure analysis, internal information is dumped, and a state of a device for which there is a mismatch is checked so that it is possible to easily perform analysis of a faulty product.

Second Exemplary Embodiment

As a second exemplary embodiment of the present invention, in identifying a fault location, by setting break points in a binary search manner, the search range of the fault location may be narrowed down. By so doing, the time required for fault can be shortened. For example, in FIG. 4, in case a program is executed from a program execution start address in CPUs 101 of microprocessors A and B (100 and 100') and a mismatch is detected in dump results of the microprocessors A and B (100 and 100') at a break point 3, step execution is not performed from break point 2, a break point is newly set at an intermediate address between break point 2 and break point 3, for example, and the program is started from the program execution start address. If there is no mismatch in the dump results at the new break point, another break point is inserted between the new break point and break point 3 (the new break point is deleted), the program is started from the program execution start address and if there is a mismatch in the dump results at the other break point, there is a fault between the new break point and the other break point, and the fault location is detected by further narrowing down the search range by binary search or by step execution.

Figure 5:
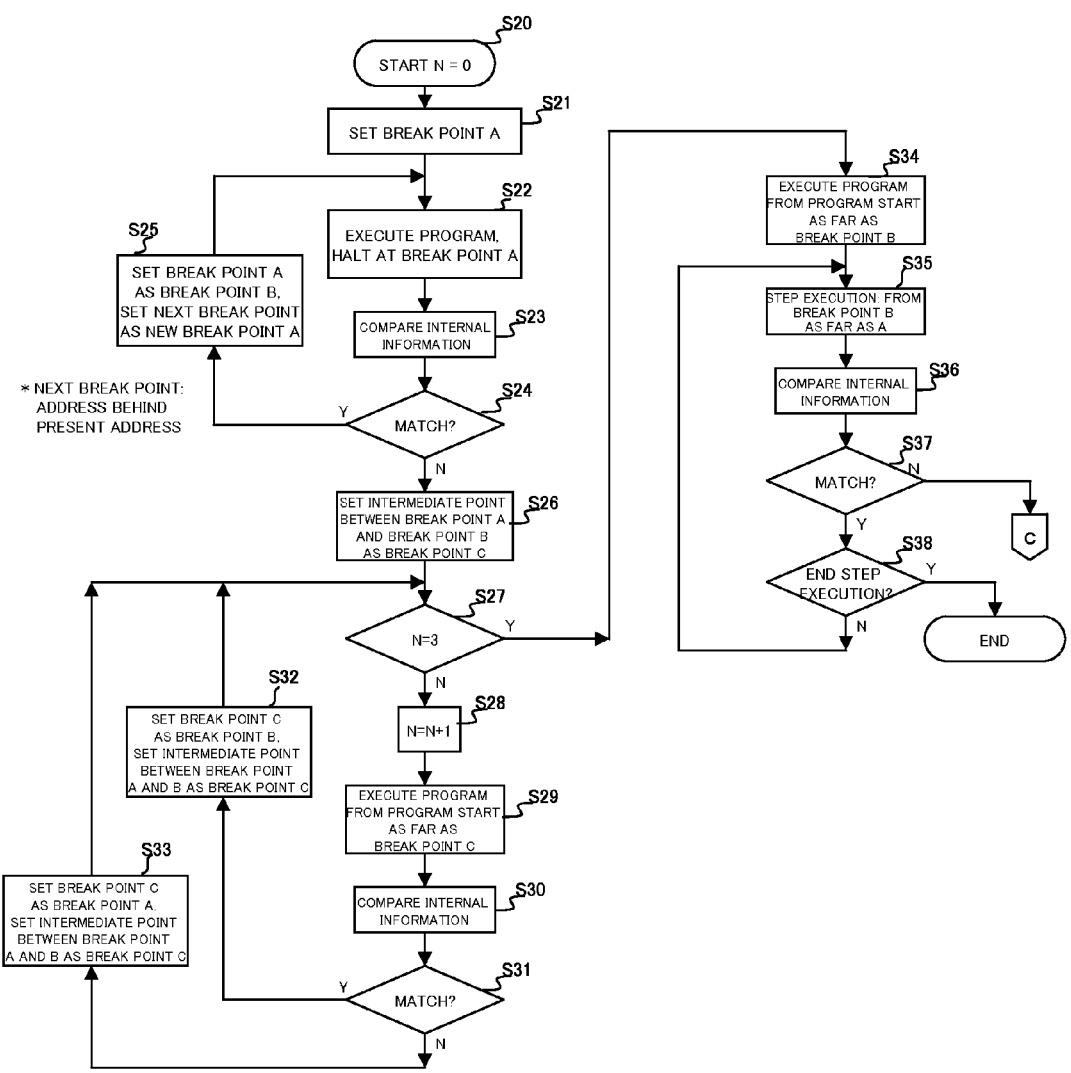
FIG. 5 is a flow diagram describing operations of another exemplary embodiment of the present invention.

FIG. 5 is a flow diagram describing operations of the second exemplary embodiment of the present invention. Operation of the present exemplary embodiment will be described with reference to FIG. 1, FIG. 2, and FIG. 5.

Variable N is initialized to 0 (step S20). Variable N is a loop variable for controlling the number of executions of the binary search.

For the microprocessors A and B (100 and 100') a break point A is set (step S21), execution is performed from the start of the program in the CPUs 101 of the microprocessors A and B (100 and 100'), the program is halted at break point A (step S22), and a comparison is made of internal information at break point A of the microprocessors A and B (100 and 100') in a host PC 120 (step S23).

If there is a match of internal information at the break point A of the microprocessors A and B (100 and 100') ("Y" branch of step S24), the break point A is set as a break point B, a subsequent break point (an address behind the present address) is set as a new break point A, and execution is performed from the step S22.

If the internal information at break point A of the microprocessors A and B (100 and 100') does not match ("N" branch in step S24), a break point C is set between break points A and B (step S26).

If N=3 is not true ("N" branch in step S27), N is incremented (step S28), and execution is performed from the start of the program up to the break point C (step S28).

The program is halted at the break point C, and internal information (dump result information) at the break point A of the microprocessors A and B (100 and 100') are compared in the host PC 120 (step S30).

If the comparison result match in the step S30 ("Y" branch in step S31), the break point C is set as a new break point B, an intermediate point between break point A and the new break point B is set as a new break point C and control is moved to the step S27 (step S32).

If the comparison result do not match in the step S30 ("N" branch in step S31), the break point C is set as a new break point A, an intermediate point between the new break point A and break point B is set as a new break point C, and control is moved to the step S27 (step S33).

In the step S27, when N=3, the program is executed from the program start to the break point B (step S34).

That is, when N=1, the program is executed from the start up to the break point C set in the step S26. Depending on a match or mismatch of the internal information (dump result information) at the break point C of the microprocessors A and B (100 and 100'), the break point C and break point B or A at the start and end of the search range are updated, and execution is performed once more from the start of the program up to the new break point C (N=2). Depending on a match or mismatch of the internal information (dump result information) at the break point C of the microprocessors A and B (100 and 100'), the break point C is updated to another value (break point B or A at the start and end of the search range is updated) and execution is performed from the start of the program up to another break point C (N=3). Depending on a match or mismatch of the internal information (dump result information) at the break point C of the microprocessors A and B (100 and 100'), the value of break point C is updated (break point B or A at the start and end of the search range is updated) and since N=3 in step S27, control is moved to a step S34. A search range for a fault location with N=3 is narrowed to a range of ¼ of the case where N=1 (narrowed down to a range of ⅛ of case N=0). Clearly the number N of binary searches is not limited to 3.

In the step S34, in the CPU 101s of the microprocessors A and B (100 and 100'), execution is performed from the program start up to the break point B, then step execution is performed from the break point B to A (step S35) and in the host PC 120 a comparison is made of internal information at break point A of the microprocessors A and B (100 and 100') (step S36).

As a result of the comparison, in case of matching ("Y" branch in step S37) a determination is made as to whether to continue with step execution. If the determination is to continue ("Y" branch in step S38), control returns to the step S35 and step execution is performed. As a result of the comparison in the step S37, in case of a mismatch ("N" branch in step S37), a description is given later with reference to FIG. 6.

According to the present exemplary embodiment the search range for a fault location is narrowed by a binary search in this way. In the exemplary embodiment shown in FIG. 4, by setting break points at relatively large intervals and performing execution one instruction at a time by performing step execution between break points before and after a mismatch occurrence, the search range of the fault location was narrowed down. In the present embodiment, the fault search range is finely narrowed to a certain extent by resetting break points and then switching to step execution is performed, thereby making it possible to reduce the number of times the program is executed.

Third Exemplary Embodiment

The third exemplary embodiment of the present invention will now be described. In a host PC 120, when dump results of microprocessors A and B (100 and 100') do not match, and a fault is detected in the microprocessor B (100'), correct memory/register values of the non-defective microprocessor A (100) may be restored to the microprocessor B (100') and execution may be performed by continuing operation thereafter. At this time, step execution of a program is performed, for example, internal information of the microprocessors A and B (100 and 100') is read for each instruction execution, and a comparison is performed in the host PC 120. If read results of the internal information of the microprocessors A and B (100 and 100') match, the step execution is continued. If a mismatch is detected, the internal information is stored. After a mismatch detection, the internal information of the non-defective microprocessor A (100) is written once again to the microprocessor B (100'), and step execution is continued. With regard to the step execution, execution may be performed up to an address set in advance, and may be stopped when a fault is detected. A break point may be set rather than performing step execution, and a fault location may be identified as in the first exemplary embodiment.

When two or more locations at which there occurs a mismatch, a comparison is made of a mismatching information item of each thereof that are subsequently stored. Targets for comparison here are, for example, an execution instruction or register name, RAM address, other data, or the like. Here, information related to matching items in the comparison results is stored.

In the microprocessors, during program execution when an operation malfunction occurs once, there is a high probability that this operation malfunction will have an effect on a subsequent operation. On the other hand, in failure analysis it is desirable to be able to confirm, with regard to each respective instruction, under what state and with which instruction the abnormal operation has occurred.

In the microprocessor B (100'), when an instruction subsequent to the instruction at which an abnormal operation has occurred is executed, by returning (resetting) to a normal state an abnormal state with regard to memory, register, and the like, it is possible to execute the program normally thereafter in the microprocessor B (100'). Thus, as a result of executing the program thereafter in the microprocessors A and B (100 and 100'), in case a fault is detected from a result of comparing internal information (dump results) of the microprocessors A and B (100 and 100'), it is possible to consider a new fault occurrence condition.

Next, in case a plurality of mismatch locations detected in this way are present, when respective internal information items are compared, if a matching item is found in the mismatching results, it is possible to infer that an operation related to this item is more deeply related with a fault operation. In the microprocessor B (100') for example, in case an abnormality always occurs in the same register, it is possible to infer that this register itself has an abnormality, or that there is an abnormality in an instruction or in a path accessing the register.

In this way, in the present exemplary embodiment, when a mismatch occurs, normal internal information of a non-defective microprocessor is written to the defective microprocessor, program execution is continued and an operation result comparison is performed. In case a plurality of operation abnormality points are found, mismatch information items of each thereof are compared and a common point is detected.

Figure 6:
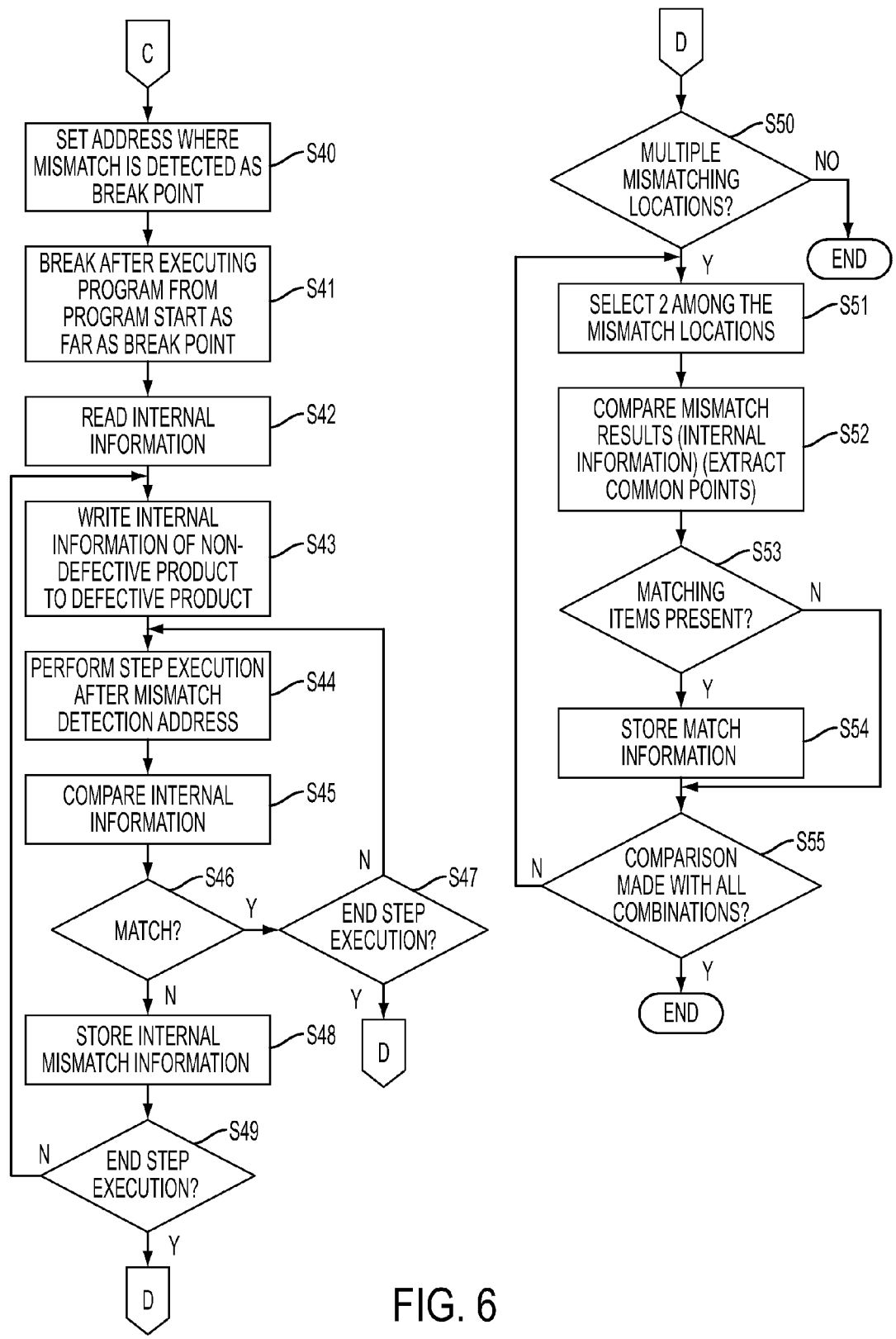
FIG. 6 is a flow diagram describing operations of another exemplary embodiment of the present invention.

FIG. 6 is a flow diagram describing operations of the present exemplary embodiment. Operation of the present exemplary embodiment is described, making reference to FIG. 1, FIG. 2, and FIG. 6.

In the step S37 of FIG. 5, in case of a mismatch in a comparison of internal information (dump results) in step execution of the microprocessors A and B (100 and 100'), an address at which the mismatch is detected is set to a break point (step S40 in FIG. 6).

In CPUs 101 of the microprocessors A and B (100 and 100'), execution is performed from the program start up to the break point, and is halted at the break point (step S41).

The internal information of the microprocessors A and B (100 and 100') are compared at the break point in the host PC 120 (step S42).

The internal information of the non-defective microprocessor A (100) is written to the defective microprocessor B (100') (step S43).

After the mismatch detection address, step execution is performed in the CPUs 101 of the microprocessors A and B (100 and 100') (step S44).

In the host PC 120, the internal information of the microprocessors A and B (100 and 100') are compared at each step when step execution is performed (step S45).

If the internal information at break point A of the microprocessors A and B (100 and 100') does not match ("N" branch of step S46), the mismatching internal information is stored on a hard disk 122 or the like in the host PC 120 (step S48). When further step execution is performed ("N" branch in step S49), control moves to the step S43. When step execution is completed ("Y" branch in step S49), control moves to the step S50.

In the step S46, in case of matching ("Y" branch in step S46), a determination is made as to whether or not step execution is completed in step S47, and when it is not completed ("N" branch in step S47), execution is performed from the step S44.

When step execution is completed in the step S47 ("Y" branch in step S47), control moves to the step S50.

In step S50 the host PC 120 determines whether or not a plurality of mismatch locations are present; if a plurality of mismatch locations are present ("Y" branch in step S50) two mismatch locations are selected (step S51), internal information of the mismatch are compared, and a common point is extracted (step S52).

If there is a matching item in the internal information of the two selected mismatch locations ("Y" branch in step S53), the host PC 120 stores matching information on the hard disk 122 (step S54).

Processing from step S51 is repeated until comparison of all combinations of a plurality of mismatch locations is completed ("N" branch in step S55). For example, where there are three mismatch locations (A, B, and C), a common point of mismatch results is found for three sets of combinations of AB, BC, and CA. The internal information that is a target for comparison includes executed instruction, register name, RAM address and data.

Figure 7:
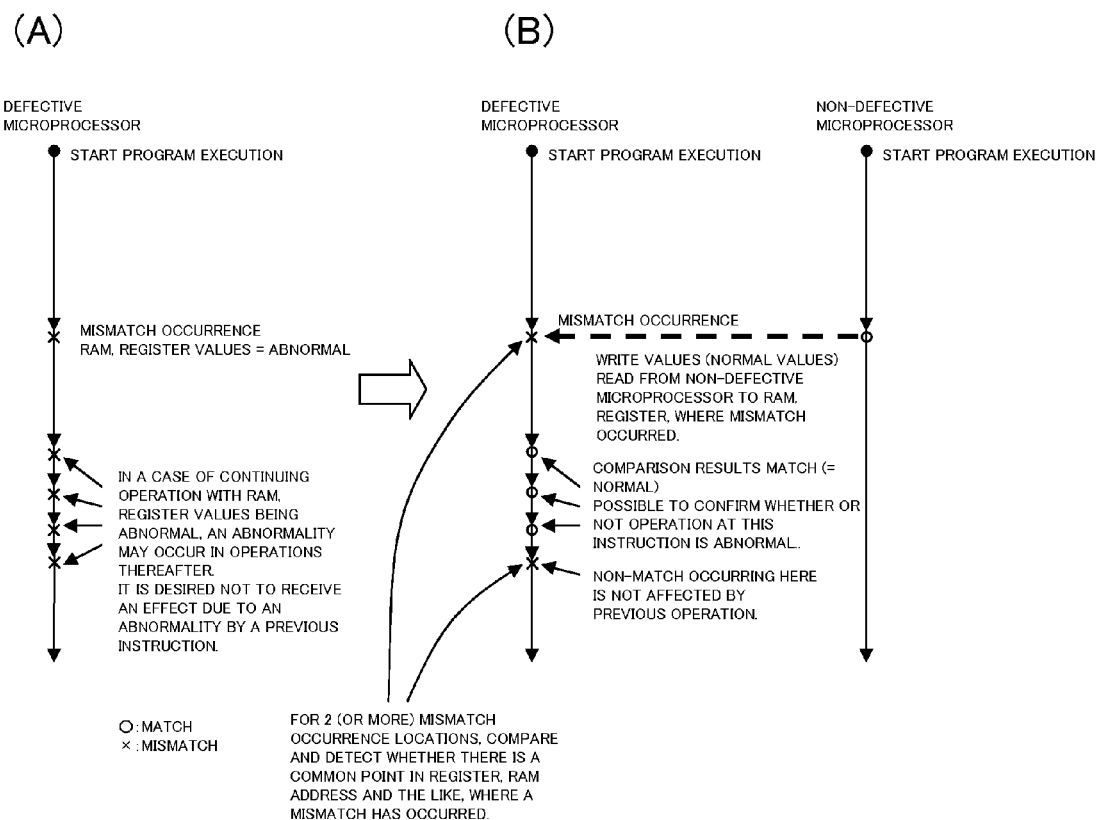
FIG. 7 is a diagram describing operations of another exemplary embodiment of the present invention.

FIG. 7 is a diagram for describing operation of the present exemplary embodiment that has been described with reference to FIG. 6. Execution of a program is started in non-defective and defective microprocessors. When a mismatch occurs, in case operation is continued with RAM and register values being abnormal, in the defective microprocessor, subsequent operation may have an abnormality. It is desirable that no effect is received due to an operation abnormality in a previous instruction (refer to (A) of FIG. 7).

Therefore, in the present exemplary embodiment, values (normal values) read from the non-defective microprocessor are written to the RAM and register in which a mismatch has occurred (refer to (B) of FIG. 7).

With regard to two or more mismatch occurrence locations, a detection is made as to whether or not there is a common point for the mismatching register, RAM address, and the like. When comparison results match in step execution, operation is normal, and it is possible to confirm whether operation of subsequent instructions in the defective microprocessor are normal or abnormal.

In the present exemplary embodiment, when a mismatch occurs in the internal information of the defective microprocessor, the mismatch that has occurred is not affected by a previous operation. As a result, it is possible to accurately perform failure analysis of the defective microprocessor.

Figure 8:
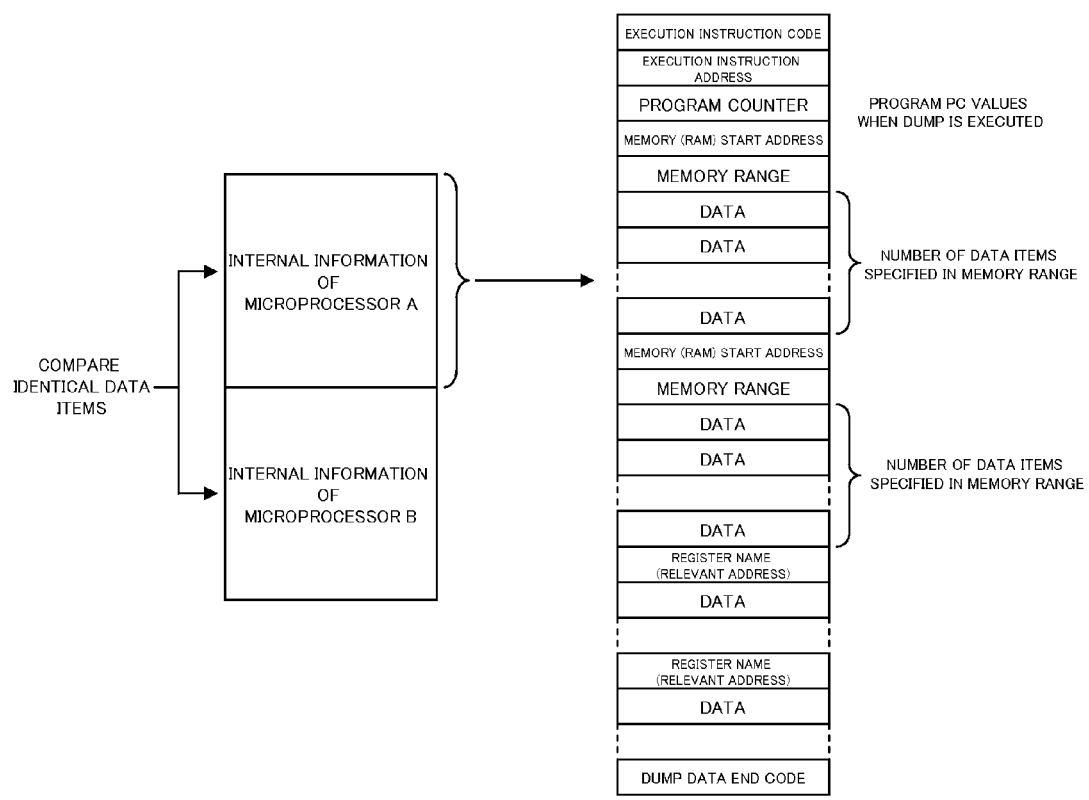
FIG. 8 is a diagram showing an example of internal information of an exemplary embodiment of the present invention.
Figure 9:
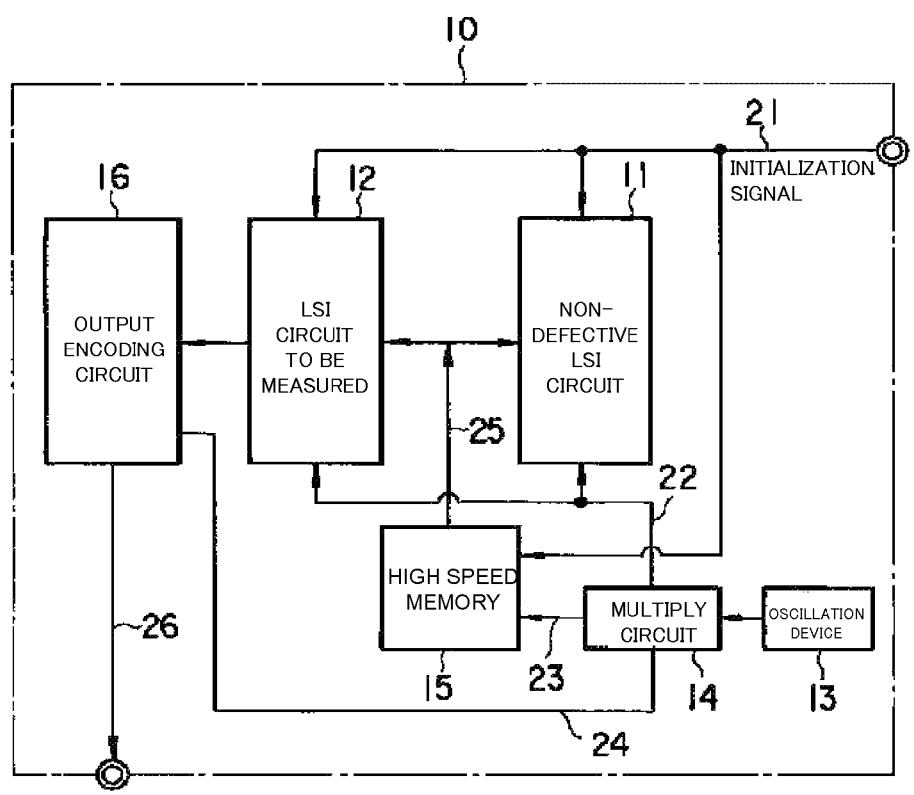
FIG. 9 is a diagram showing a configuration of Patent Document 1.
Figure 10:
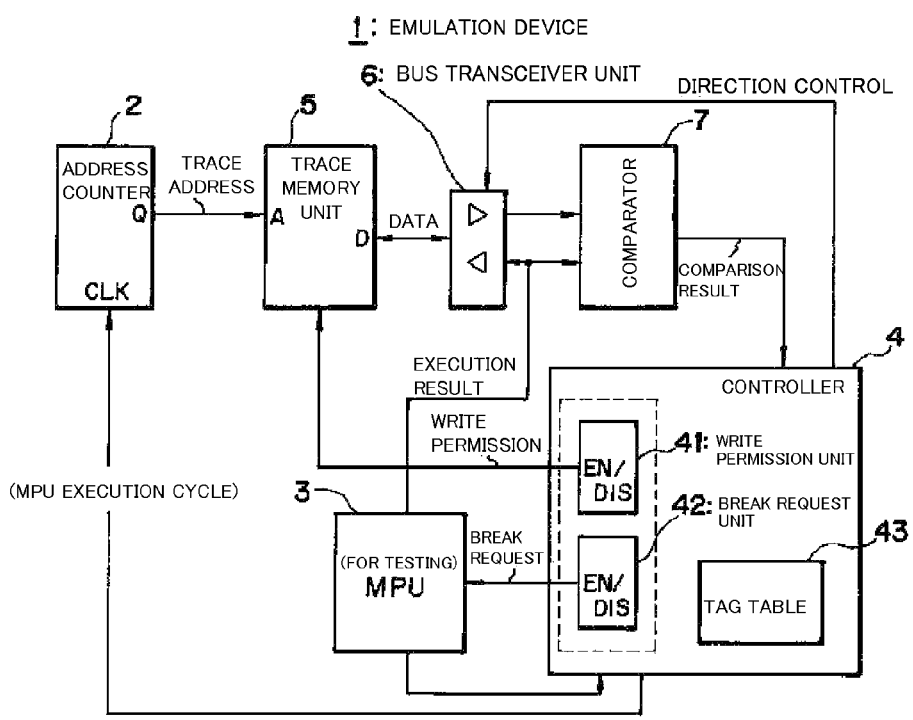
FIG. 10 is a diagram showing a configuration of Patent Document 2.

FIG. 8 is a diagram showing an example of internal information of a microprocessor used in the abovementioned first to third exemplary embodiments. The internal information of FIG. 8 corresponds to a data structure in a storage device (such as a buffer) of the host PC 120 that has obtained the dump information of the RAMs 105, registers, and the like of the microprocessors A and B (100 and 100') at a break point or at each step when step execution is performed. Referring to FIG. 8, the internal information of the microprocessor A includes an execution instruction, an execution instruction address, a program counter when a dump is executed, a memory start address, a memory address range, data (number of data items specified in a memory range), register name, data, and dump end code. Similar information is stored for the microprocessor B.

As described above, according to each of the above-mentioned exemplary embodiments, by using the on-chip debug function equipped in the microprocessors, it is possible to confirm the internal information (register, memory, and the like) of a microprocessor at a point in time where a fault operation is detected.

By connecting two debug I/F devices to one host PC and storing the dump results only when an abnormality occurs, non-defective and fault products are independently operated, and large capacity memory for storing results required for comparing the results later is made unnecessary. Therefore, according to the present exemplary embodiment, in order to reproduce a fault phenomenon that has low reproducibility, even in case of continuous operation for a long time, it is possible to avoid memory overflow and to effectively perform failure analysis. In addition, tasks such as replacing microprocessors halfway in the debug operation are unnecessary.

Furthermore, according to each of the above-mentioned exemplary embodiments, when a mismatch in internal information between the microprocessors A and B (100 and 100') is detected, by designating in advance a debug operation to be performed next, it is possible to automatically switch the debug operation and to perform analysis with good efficiency. For example, first a break point is set, an approximate operation abnormality address is grasped, and when a mismatch is detected, by switching automatically to a step operation it is possible to identify an address at which a failure ha occurred.

According to each of the abovementioned exemplary embodiments, by implementing the greater part of this type of comparison and processing after mismatch detection by software processing (failure analysis software) executed on the host PC, it is possible to provide a low cost debug and analysis tool that has flexibility and that fits a user's circumstances.

The various disclosures of the abovementioned Patent Documents 1 and 2 are incorporated herein by reference thereto. Modifications and adjustments of embodiments are possible within the bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention clearly includes every type of transformation and modification that those skilled in the art can realize according to technological concepts and the entire disclosure including the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A failure analysis apparatus comprising:
a host machine;
first and second microprocessors of an identical configuration, the first microprocessor being a known good device, while the second microprocessor being a target for failure analysis; and
first and second debug interface devices connecting the host machine to the first and second microprocessors, respectively,
the host machine controlling debugging of the first and second microprocessors, via the first and second debug interface devices, wherein the host machine comprises
a unit that causes the first and second microprocessors to execute identical debug operations in parallel, via the first and second debug interface devices, obtains internal information of the first and second microprocessors, via the first and second debug interface devices, and compares the internal information of the first and second microprocessors to perform failure analysis of the second microprocessor,
wherein the host machine sets a plurality of break points in respective programs of the first and second microprocessors via the first and second debug interface devices, and
in case the internal information obtained from the first and second microprocessors at a first break point matches and the internal information obtained from the first and second microprocessors at a second break point executed by the first and second microprocessors after the first break point does not match, as a subsequent operation, the host machine changes a debug command so that instructions between the first break point and the second break point are executed by step-execution, and supplies the changed debug command to the first and second microprocessors via the first and second debug interface devices.

2. The failure analysis apparatus according to claim 1, wherein the host machine designates in advance a debug operation which is to be performed next in the first and second microprocessors when a mismatch in the internal information of the first and second microprocessors is detected.

3. A failure analysis apparatus comprising:
a host machine;
first and second microprocessors of an identical configuration, the first microprocessor being a known good device, while the second microprocessor being a target for failure analysis; and
first and second debug interface devices connecting the host machine to the first and second microprocessors, respectively,
the host machine controlling debugging of the first and second microprocessors, via the first and second debug interface devices, wherein the host machine comprises
a unit that causes the first and second microprocessors to execute identical debug operations in parallel, via the first and second debug interface devices, obtains internal information of the first and second microprocessors, via the first and second debug interface devices, and compares the internal information of the first and second microprocessors to perform failure analysis of the second microprocessor,
wherein the host machine sets a break point in a binary search manner in respective programs of the first and second microprocessors via the first and second debug interface devices,
wherein the host machine sets first and second break points corresponding to start and end of a search range in the respective programs of the first and second microprocessors via the first and second debug interface devices, and
in case the internal information obtained from the first and second microprocessors at the first break point matches, and the internal information obtained from the first and second microprocessors at the second break point executed by of the first and second microprocessors after the first break point does not match, the host machine directs the first and second microprocessors via the first and second debug interface devices to set an intermediate point between the first break point and the second break point as a third break point.

4. The failure analysis apparatus according to claim 3, wherein in case the first and second microprocessors each execute a program from program start as far as the third break point, and the internal information obtained from the first and second microprocessors at the third break point matches, the host machine sets the third break point as a new first break point, and sets an intermediate point between the new first break point and the second break point as a third break point, and in case internal information obtained from the first and second microprocessors at the third break point does not match, the host machine directs the first and second microprocessors via the first and second debug interface devices to set the third break point as a new second break point, and an intermediate point between the new second break point and the first break point as a third break point.

5. A failure analysis apparatus comprising:

a host machine;

first and second microprocessors of an identical configuration, the first microprocessor being a known good device, while the second microprocessor being a target for failure analysis; and first and second debug interface devices connecting the host machine to the first and second microprocessors, respectively, the host machine controlling debugging of the first and second microprocessors, via the first and second debug interface devices, wherein the host machine comprises a unit that causes the first and second microprocessors to execute identical debug operations in parallel, via the first and second debug interface devices, obtains internal information of the first and second microprocessors, via the first and second debug interface devices, and compares the internal information of the first and second microprocessors to perform failure analysis of the second microprocessor, wherein in case internal information obtained from the first and second microprocessors at one break point does not match, the host machine, after writing at least a part of the internal information of the first microprocessor to the second microprocessor to set the second microprocessors to have the same information with regard to at least the part of the internal information thereof as that of the first microprocessor, performs control to carry out re-execution in the first and second microprocessor from an instruction subsequent to the one break point.

6. The failure analysis apparatus according to claim 5, wherein the host machine performs re-execution as step-execution, and in case the internal information obtained from the first and second microprocessors at one break point does not match, the host machine stores mismatching information in a storage unit thereof; and as a result of the step execution, if there are a plurality of items of the mismatching information stored in the storage unit, the host machine extracts a common point of at least two items of mismatching information among the plurality of items of the mismatching information.

\* \* \* \* \*